(12) United States Patent
Park

(10) Patent No.: US 6,833,232 B2
(45) Date of Patent: Dec. 21, 2004

(54) MICRO-PATTERN FORMING METHOD FOR SEMICONDUCTOR DEVICE

(75) Inventor: Cheol Soo Park, Kyoungki-do (KR)

(73) Assignee: Dongbu Electronics Co., Ltd., Seoul (KR)

( * ) Notice: Subject to any disclaimer, the term of this patent is extended or adjusted under 35 U.S.C. 154(b) by 143 days.

(21) Appl. No.: 10/338,506

(22) Filed: Jan. 8, 2003

(65) Prior Publication Data

US 2003/0180669 A1 Sep. 25, 2003

Related U.S. Application Data

(63) Continuation-in-part of application No. 10/321,936, filed on Dec. 17, 2002, now abandoned.

(30) Foreign Application Priority Data

Dec. 20, 2001 (KR) ................................ 10-2001-0081791

(51) Int. Cl.[7] .............................................. H01L 21/311
(52) U.S. Cl. ....................... 430/314; 430/316; 430/317; 438/671; 438/699; 438/700; 438/706
(58) Field of Search ................................ 430/314, 316, 430/317; 438/671, 699, 700, 706

(56) References Cited

U.S. PATENT DOCUMENTS

| 3,998,678 A | | 12/1976 | Fukase et al. | |
| 5,844,274 A | * | 12/1998 | Tsutsumi | ................... 257/333 |

* cited by examiner

*Primary Examiner*—John A. McPherson
*Assistant Examiner*—Daborah Chacko-Davis
(74) *Attorney, Agent, or Firm*—Timothy J. Keefer; Seyfarth Shaw LLP

(57) ABSTRACT

Disclosed is a micro-pattern forming method for a semiconductor device comprising: sequentially forming first and second insulation films on a semiconductor substrate; forming a photosensitive film on the second insulation film; dry etching the second insulation film; removing the photosensitive film; forming a third insulation film on the substrate; forming a fourth insulation film on a resultant structure; etching the third and fourth insulation films using a proper formal solution; etching the third insulation film using the fourth and second insulation films as masks to form a third insulation film pattern; and filling a conductive film into spaces between the second and third insulation films and second flattening the conductive film to form conductive lines.

4 Claims, 2 Drawing Sheets

MICRO-PATTERN FORMING METHOD FOR SEMICONDUCTOR DEVICE

This application is a Continuation-in-part (CIP) of U.S. patent application Ser. No. 10/321,936 filed Dec. 17, 2002, abandoned, claiming the foreign priority of Korean patent application No. 2001-81791, filed Dec. 20, 2001.

BACKGROUND OF THE INVENTION

1. Field of the Invention

The present invention relates to a micro-pattern forming method for a semiconductor device, in particular, which can form a micro-pattern corresponding to high integration of the semiconductor device.

2. Description of the Prior Art

FIG. 1 is a sectional view illustrating a micro-pattern forming method for a semiconductor device of the related art.

First, a conductive film 20 and a photosensitive film 30 are sequentially formed on a first insulator layer 10. The photosensitive film 30 is patterned to have a pitch '$\alpha+\beta$', and then the conductive film 20 is locally dry-etched using the photosensitive film 30 as a mask. The dry-etched photosensitive film 30 is removed to form a pattern.

In general, as semiconductors are reduced in size, it is more difficult to obtain a precise pattern size even though investment and endeavor are being devoted in large amounts to the formation of super-micro patterning.

For example, if the pattern pitch is about 0.20 $\mu$m, it is necessary to form a micro-pattern having a spacing of about 0.10 $\mu$m in a line of about 0.10 $\mu$m. Where the pattern pitch is about 0.20 $\mu$m, ArF equipment and a photoresist (PR) are conventionally used in the formation of the pattern.

If the pattern pitch is 0.40 $\mu$m, KrF equipment and a PR for the KrF equipment may be used.

However, with the KrF equipment used for patterning a 0.40 $\mu$m pitch and the PR for the KrF equipment, the conventional micro-pattern forming method has not succeeded in patterning a 0.20 $\mu$m pitch.

SUMMARY OF THE INVENTION

The present invention has been made to solve the foregoing problems, and it is therefore an object of the present invention to provide a micro-pattern forming method for a semiconductor device, by which the micro-pattern corresponding to high integration of a semiconductor device can be formed from two materials having a large difference in dry etching, selectivity so as to save manufacturing cost.

According to an aspect of the invention for realizing the above object, a micro-pattern forming method for a semiconductor device having a pitch size of $\alpha+\beta$ comprises the following steps of: sequentially forming first and second insulation films on a semiconductor substrate; forming a photosensitive film in a proper configuration on the second insulation film, the photosensitive film having a second pitch size which is twice the first pitch size of $\alpha+\beta$; dry etching the second insulation film using the photosensitive film as a mask; removing the photosensitive film; forming a third insulation film on an entire surface of the substrate including remaining portions of the second insulation film; forming a fourth insulation film on a resultant structure in portions corresponding to those between the remaining portions of the second insulation film; etching the third and fourth insulation films using a proper formal solution, whereby the third insulation film has a dry etching selectivity of 1 to 1 in respect to the fourth insulation film, to first flatten the forth insulation film until the second insulation film is exposed; etching the third insulation film using the fourth and second insulation films as masks to form a third insulation film pattern; and filling a conductive film into spaces between the second and third insulation films and second flattening the conductive film to form conductive lines having a pitch size of $\alpha+\beta$.

It is preferred that the first flattening step is performed via etchback.

It is preferred that the second flattening step is performed via CMP or etchback.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENT

The following detailed description will present a preferred embodiment of the invention in reference to the accompanying drawings.

FIGS. 2A to 2E are sectional views illustrating a micro-pattern forming method for a semiconductor device according to a preferred embodiment of the invention.

Figure 1:
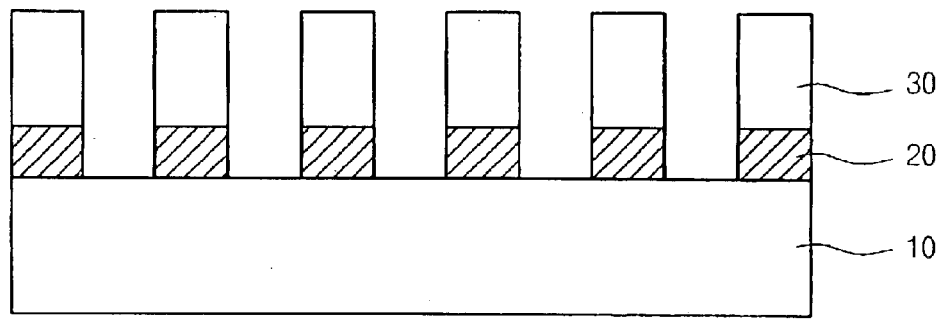
FIG. 1 is a sectional view illustrating a micro-pattern forming method for a semiconductor device of the related art.
Figure 2A:
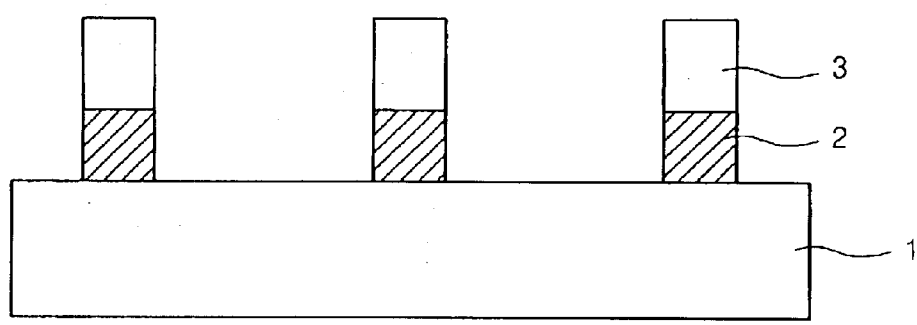
FIGS. 2A to 2E are sectional views illustrating a micro-pattern forming method for a semiconductor device according to a preferred embodiment of the invention.

As shown in FIG. 2A, a first insulation film 1 and a second insulation film (including a portion designated by the reference number 2) are sequentially formed on a semiconductor substrate (not shown) and then a photosensitive film pattern 3 is formed in a specific configuration on the second insulation film in order to finally form a pitch substantially identical with the pitch shown in FIG. 1. The photosensitive film pattern 3 is patterned to have a pitch which is twice the pitch $\alpha+\beta$ in FIG. 1. The second insulation film is dry-etched forming a second insulation film pattern 2. In this circumstance, it is required to form the second insulation film at a thickness much larger than a third insulation film which will be formed after formation of the second insulation film, in order to adjust critical dimension (CD) based upon the thickness of the third insulation film.

Figure 2B:
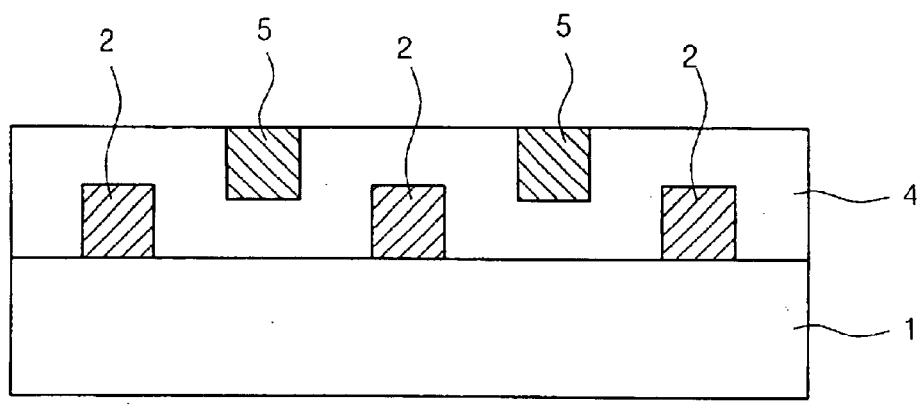

Then, as shown in FIG. 2B, upon removal of the photosensitive film pattern, the third insulation film 4 is deposited on the first insulation film 1 and the second insulation film pattern 2, and a fourth insulation film 5 is formed in portions corresponding to those between the remaining portions of second insulation film pattern 2.

Next, a flattening process is performed on the third and fourth insulation films 4 and 5 via Chemical Mechanical Polishing (CMP).

Figure 2C:
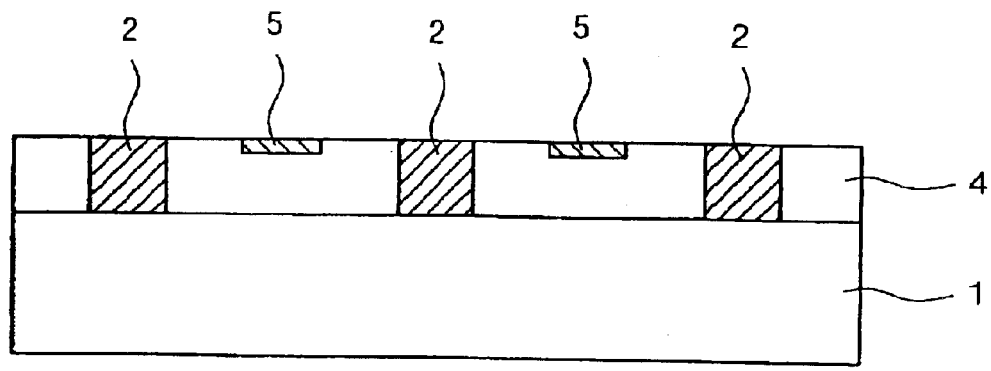

Then, as shown in FIG. 2C, the third and the fourth insulation films 4 and 5 are etched back according to a specific recipe, whereby the dry etching selectivity of the third insulation film and fourth insulation film 5 is 1 to 1. When the second insulation film 2 is exposed, etching is stopped.

Figure 2D:
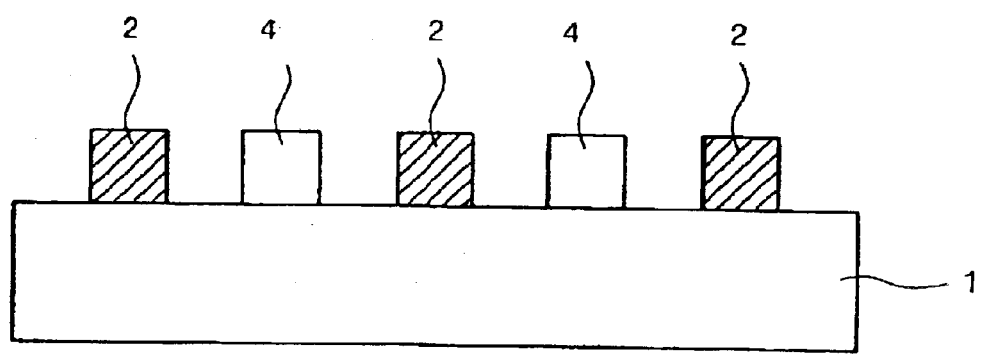

Then, as shown in FIG. 2D, the third insulation film 4 is etched according to a specific recipe, whereby the second and fourth insulation films 2 and 5 have a high etching selectivity of 10 to 1 in respect to the third insulation film 4. This causes the third insulation film underlying the fourth insulation film 5 to form into a third insulation pattern 4. Then, after having served as a mask, the remaining thickness of the fourth insulation film 5 is removed at a 1 to 1 recipe.

Figure 2E:
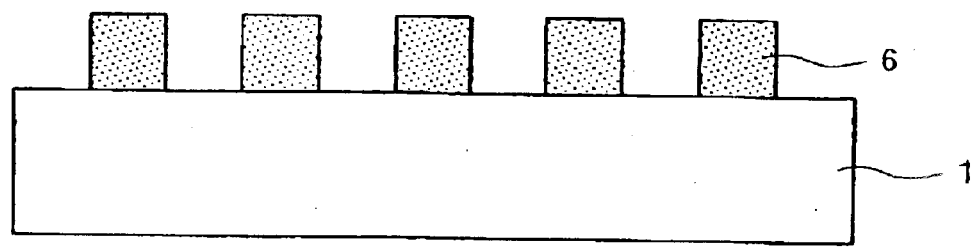

As shown in FIG. 2E, a conductive film (including a portion indicated by the reference number 6) is filled between remaining portions of the second and third insulation films 2 and 4 in FIG. 2D, and then flattening is performed via CMP or etchback. The second insulation film 2 and the third insulation film 4 are removed using the conductive film as a mask thereby forming conductive film lines 6 having a pitch substantially identical with that in FIG. 1.

According to the micro-pattern forming method for a semiconductor device of the invention as set forth above, a micro-pattern forming method for a semiconductor device, by which a micro-pattern corresponding to high integration of a semiconductor device can be formed from two materials having a large difference in dry etching selectivity so as to save manufacturing cost.

Although the preferred embodiments of the present invention have been disclosed for illustrative purposes, those skilled in the art will appreciate that various modifications, additions and substitutions can be made without departing from the scope and spirit of the invention as disclosed in the accompanying claims.

What is claimed is:

1. A micro-pattern forming method for a semiconductor device having a first pitch size of $\alpha+\beta$, the method comprising the following steps of:

sequentially forming first and second insulation films on a semiconductor substrate;

forming a photosensitive film in a proper configuration on the second insulation film, the photosensitive film having a second pitch size which is twice the first pitch size of $\alpha+\beta$;

dry etching the second insulation film using the photosensitive film as a mask;

removing the photosensitive film;

forming a third insulation film on an entire surface of the substrate including remaining portions of the second insulation film;

forming a fourth insulation film on a resultant structure in portions corresponding to those between the remaining portions of the second insulation film;

etching the third and fourth insulation films using a proper formal solution, whereby the third insulation film has a dry etching selectivity of 1 to 1 in respect to the fourth insulation film, to first flatten the fourth insulation film until the second insulation film is exposed;

etching the third insulation film using the fourth and second insulation films as masks to form a third insulation film pattern; and filling a conductive film into spaces between the second and third insulation films and second flattening the conductive film to form conductive lines having a pitch size of $\alpha+\beta$.

2. A micro-pattern forming method for a semiconductor device in accordance with claim 1, wherein the first flattening step is performed via etchback.

3. A micro-pattern forming method for a semiconductor device in accordance with claim 1, wherein the second flattening step is performed via CMP.

4. A micro-pattern forming method for a semiconductor device in accordance with claim 1, wherein the second flattening step is performed via etchback.

* * * * *